United States Patent
Yamagishi et al.

(10) Patent No.: US 11,485,686 B2
(45) Date of Patent: Nov. 1, 2022

(54) CERAMIC, PROBE GUIDING MEMBER, PROBE CARD, AND SOCKET FOR PACKAGE INSPECTION

(71) Applicant: FERROTEC MATERIAL TECHNOLOGIES CORPORATION, Tokyo (JP)

(72) Inventors: Wataru Yamagishi, Tokyo (JP); Kazumasa Mori, Tokyo (JP); Shunichi Eto, Tokyo (JP)

(73) Assignee: FERROTEC MATERIAL TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/762,802

(22) PCT Filed: Nov. 7, 2018

(86) PCT No.: PCT/JP2018/041330
§ 371 (c)(1),
(2) Date: May 8, 2020

(87) PCT Pub. No.: WO2019/093370
PCT Pub. Date: May 16, 2019

(65) Prior Publication Data
US 2021/0188714 A1  Jun. 24, 2021

(30) Foreign Application Priority Data
Nov. 10, 2017 (JP) .............................. JP2017-217700

(51) Int. Cl.
*C04B 35/488* (2006.01)
*G01R 1/04* (2006.01)
(Continued)

(52) U.S. Cl.
CPC .......... *C04B 35/488* (2013.01); *C04B 35/584* (2013.01); *G01R 1/0408* (2013.01);
(Continued)

(58) Field of Classification Search
CPC ................ C04B 35/488; C04B 35/584; C04B 2235/3244; C04B 2235/3873;
(Continued)

(56) References Cited

U.S. PATENT DOCUMENTS 4,764,490 A * 8/1988 Yamakawa ........... C04B 35/584
501/97.2
4,769,350 A * 9/1988 Nishioka ............... C04B 35/584
264/125
(Continued)

FOREIGN PATENT DOCUMENTS

| CN | 106938932 A | 7/2017 |
|---|---|---|
| JP | 64-5975 A | 1/1989 |

(Continued)

OTHER PUBLICATIONS

JP2005119941 machine translation via EspaceNet (Year: 2005).*
(Continued)

*Primary Examiner* — Karl E Group
*Assistant Examiner* — Cameron K Miller
(74) *Attorney, Agent, or Firm* — Birch, Stewart, Kolasch & Birch, LLP

(57) ABSTRACT

A ceramic contains, in mass percent: $Si_3N_4$: 20.0 to 60.0%, $ZrO_2$: 25.0 to 70.0%, and one or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$: 5.0 to 15.0%. The ceramic has a coefficient of thermal expansion as high as that of silicon and an excellent mechanical strength, allows fine machining with high precision, and prevents particles from being produced.

12 Claims, 3 Drawing Sheets

(51) Int. Cl.
*G01R 1/073* (2006.01)
*C04B 35/584* (2006.01)

(52) U.S. Cl.
CPC .. *G01R 1/07371* (2013.01); *C04B 2235/3244* (2013.01); *C04B 2235/3873* (2013.01); *C04B 2235/762* (2013.01); *C04B 2235/9607* (2013.01)

(58) Field of Classification Search
CPC ...... C04B 2235/762; C04B 2235/9607; C04B 2235/3206; C04B 2235/3208; C04B 2235/3217; C04B 2235/3225; C04B 2235/3229; C04B 2235/3232; C04B 2235/3239; C04B 2235/3241; C04B 2235/3246; C04B 2235/3251; C04B 2235/3279; C04B 2235/3284; C04B 2235/3286; C04B 2235/3418; C04B 2235/07; C04B 35/486; C04B 35/587; C04B 35/593; G01R 1/0408; G01R 1/07371
See application file for complete search history.

(56) References Cited

U.S. PATENT DOCUMENTS

| | | |
|---|---|---|
| 2004/0082205 A1 | 4/2004 | Nishihata et al. |
| 2005/0130829 A1 | 6/2005 | Etoh et al. |
| 2008/0038517 A1 | 2/2008 | Nishihata et al. |

FOREIGN PATENT DOCUMENTS

| | | | |
|---|---|---|---|
| JP | 64-33072 A | | 2/1989 |
| JP | 01033072 A | * | 2/1989 |
| JP | 11-118968 A | | 4/1999 |
| JP | 2005-119941 A | | 5/2005 |
| JP | 2005119941 | * | 5/2005 |
| JP | 2005-228031 A | | 8/2005 |
| JP | 2008024579 | * | 2/2008 |
| JP | 2013-209244 A | | 10/2013 |
| TW | 200512169 A | | 4/2005 |
| WO | WO 02/082592 A1 | | 10/2002 |

OTHER PUBLICATIONS

JP2008024579 machine translation (Year: 2008).*
JP-01033072-A machine translation (Year: 1989).*
International Preliminary Report on Patentability and Written Opinion of the International Searching Authority (Forms PCT/IB/373 and PCT/ISA/237) for International Application No. PCT/JP2018/041330, dated May 12, 2020, with an English translation.
International Search Report (Form PCT/ISA/210) for International Application No. PCT/JP2018/041330, dated Feb. 12, 2019, with an English translation.
Taiwanese Office Action and Search Report for corresponding Taiwanese Application No. 107139761, dated Nov. 5, 2020, with a partial English translation.
Extended European Search Report for corresponding European Application No. 18876607.5, dated May 27, 2021.
Japanese Notice of Reasons for Refusal for corresponding Japanese Application No. 2019-552346, dated Oct. 5, 2021, with an English translation.

* cited by examiner

50um

50um

1um

1um

CERAMIC, PROBE GUIDING MEMBER, PROBE CARD, AND SOCKET FOR PACKAGE INSPECTION

TECHNICAL FIELD

The present invention relates to a ceramic, a probe guiding member, a probe card, and a socket for package inspection.

BACKGROUND ART

A probe card is used in, for example, an inspection process on IC chips. FIG. 1 illustrates a cross-sectional view illustrating a configuration of a probe card as an example, and FIG. 2 is a top view illustrating the configuration of the probe guide as an example. As illustrated in FIG. 1 and FIG. 2, a probe card 10 is an inspection jig that includes needle-shaped probes 11 and a probe guide (probe guiding member) 12 including through holes 12a for allowing the probes 11 to be inserted therethrough. By bringing the probes 11 into contact with IC chips 14 that are formed on a silicon wafer 13, inspection of the IC chips 14 is conducted.

Patent Document 1 exemplifies a ceramic that contains a mixture of 25 to 60 mass % of silicon nitride and 40 to 75 mass % of boron nitride, as its main raw material. In addition, Patent Document 2 discloses an invention relating to a free-machining ceramic that contains 30 to 50 mass % of boron nitride and 50 to 70 mass % of zirconia, as its main raw material.

LIST OF PRIOR ART DOCUMENTS

Patent Document

Patent Document 1: JP2005-226031A
Patent Document 2: WO 2002/082592

SUMMARY OF INVENTION

Technical Problem

As devices move toward finer design rules and higher performance in recent years, a probe guide used for an inspection apparatus for the devices are required to have a thermal expansivity as high as that of the silicon wafer 13, to have a mechanical strength (flexural strength) that allows the probe guide to withstand a probe load, and to allow high-precision machining of a large number of holes through which fine probes are to be inserted.

For example, an inspection efficiency of an inspection process on IC chips depends on how many probes can be brought into contact with IC chips at the same time. Hence, recent years have been seeing a practical application of a probe card on which tens of thousands of minute probes are set upright with high density by the micro-electromechanical systems (MEMS). As illustrated in FIG. 2 given above, the probe guide 12 needs to be provided with the through holes 12a at positions corresponding to the probes 11 of the probe card 10. Setting positions, a shape, and the like of the probes 11 of the probe card 10 vary according to specifications of the inspection apparatus, and setting positions, a shape, and the like of the through holes 12a vary accordingly. For example, in a case where the probes 11 have a pin shape, a circular hole is adapted for the through holes 12a, and the through holes 12a need to be formed in various shapes according to the shape of the probes 11.

An inner diameter of the holes and a pitch of the holes depend on a kind or an arrangement of the probes 11; for example, there is a case where through holes having a diameter of 50 μm are arranged with a 60 μm pitch (a wall thickness between the through holes is about 10 μm). It is necessary to provide tens of thousands of such small through holes. This requires a material that facilitates precise machining. In particular, particles, which could be produced when the through holes 12a of the probe guide 12 come into contact with the probes 11, may give rise to damage to the device, a poor inspection, and an increase in number of maintenance times of the probe card 10. Therefore, the through holes 12a of the probe guide 12 are also required to have inner surfaces with a low roughness, that is, smooth machined surfaces.

Here, with finer wiring of IC chips, there have been a tendency of an increase in the number of probes and a decrease in the distance (pitch) between pads to be in contact with the probes, and a need for further enhancement in positional precision of the probes. To support this narrow pitch, miniaturization of probes is in progress, and use of probes having various shapes has been started. At the same time, for a material used for the probe guide, there arise needs for decreasing its thickness, forming fine holes that are accommodated to changes in shapes of probes, and the like, for a purpose of improving the positional precision of the probes.

However, as a thickness of the material for the probe guide is reduced, a strength of the member is decreased, so that the probe guide cannot withstand a probe load to deform, and consequently, the positional precision of the probes decreases. Moreover, the material for the probe guide can be broken in some cases. To deal with these demands, the probe guide is required to have extremely excellent mechanical properties.

The above description is made mainly about the probe guide, and applications of which similar qualities are required include a socket for inspection such as a socket for package inspection.

Here, the ceramics described in Patent Documents 1 and 2 are ceramics having coefficients of thermal expansion as high as that of silicon and having a certain level of mechanical strengths and free-machining properties, but no consideration is given to smoothness of their machined surfaces.

The present invention has an objective to provide a ceramic that has a coefficient of thermal expansion as high as that of silicon and an excellent mechanical strength, allows fine machining with high precision, includes a smooth machined surface, and can prevent particles from being produced in its use, and to provide a probe guiding member, a probe card, and a socket for inspection that are made of the ceramic.

Solution to Problem

To achieve the objective, the present inventors conducted intensive studies on a basis of obtaining a ceramic that has a thermal expansivity as high as that of a silicon wafer and a high strength by combining $Si_3N_4$, which is a high strength ceramic, and $ZrO_2$, which is a high expansive ceramic, and as a result, obtained the following findings.

(a) A ceramic material made by combining $Si_3N_4$ and $ZrO_2$ is an extremely hard material and thus difficult to form fine holes by machining. Hence, it is preferable to form the fine holes by laser beam machining to obtain the probe guide plate.

(b) However, it is difficult for simply performing the laser beam machining to smooth the machined surface (e.g., inner surfaces of the through holes of the probe guide). Hence, a predetermined amount of oxides are contained. Examples of the oxides include MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$.

The present invention is made based on the above findings, and the gist of the present invention is as follows.

(1) A ceramic containing, in mass percent:
$Si_3N_4$: 20.0 to 60.0%;
$ZrO_2$: 25.0 to 70.0%; and
one or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$: 5.0 to 15.0%.

(2) The ceramic according to the above (1) containing, in mass percent:
one or more oxides selected from MgO, $Y_2O_3$, $CeO_2$, CaO, and $HfO_2$; and
one or more oxides selected from $TiO_2$, $Al_2O_3$, $SiO_2$, $MoO_3$, CrO, CoO, ZnO, $Ga_2O_3$, $Ta_2O_5$, NiO, and $V_2O_5$.

(3) The ceramic according to the above (1) or (2), wherein a crystal phase of $ZrO_2$ is one of a crystal phase being a tetragonal crystal, a crystal phase being a tetragonal crystal and a monoclinic crystal, a crystal phase being a cubic crystal, a crystal phase being a cubic crystal and a tetragonal crystal, and a crystal phase being a cubic crystal and a monoclinic crystal.

(4) The ceramic according to any one of the above (1) to (3), wherein a crystal phase of $ZrO_2$ is a cubic crystal.

(5) The ceramic according to any one of the above (1) to (4), wherein the ceramic has a coefficient of thermal expansion at −50 to 500° C. ranging from $3.0 \times 10^{-6}$ to $6.0 \times 10^{-6}$ 1° C. and has a three-point flexural strength of 700 MPa or more.

(6) A probe guiding member that guides probes of a probe card, the probe guiding member including:
a plate-shaped main body that is made of the ceramic according to any one of the above (1) to (5); and
the main body includes a plurality of through holes and/or slits through which the probes are to be inserted.

(7) The probe guiding member according to the above (6), wherein a surface roughness of inner surfaces of the plurality of through holes and/or slits is 0.25 µM or less in terms of Ra.

(8) A probe card including:
a plurality of probes; and
the probe guiding member according to the above (6) or (7).

(9) A socket for package inspection, wherein the socket for package inspection is made of the ceramic according to any one of the above (1) to (5).

Advantageous Effects of Invention

The present invention makes it possible to obtain a ceramic that has a coefficient of thermal expansion as high as that of silicon and an excellent mechanical strength, allows fine machining with high precision, includes a smooth machined surface, and can prevent particles from being produced in its use, which is thus useful particularly to a probe guiding member, a probe card, and a socket for inspection.

DESCRIPTION OF EMBODIMENTS

1. Ceramic

Figure 1:
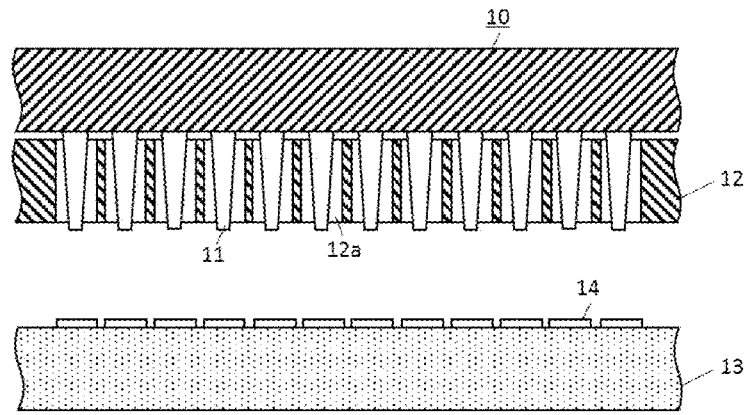
FIG. 1 is a cross-sectional view illustrating a configuration of a probe card as an example.
Figure 2:
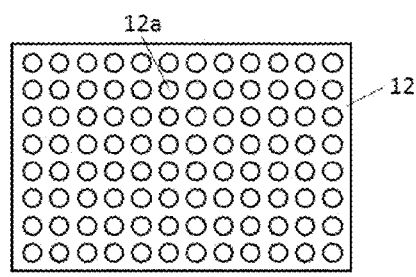
FIG. 2 is a top view illustrating the configuration of the probe guide as an example.

A ceramic according to the present invention contains, in mass percent, $Si_3N_4$: 20.0 to 60.0%, $ZrO_2$: 25.0 to 70.0%, and one or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$: 5.0 to 15.0%. In the following description, the symbol "%" for contents means "percent by mass."

$Si_3N_4$: 20.0 to 60.0%;

$Si_3N_4$ is useful for giving a high strength to the ceramic, and in order to obtain a flexural strength as high as 700 MPa or more, 20.0% or more of $Si_3Na$ needs to be contained. However, if a content of $Si_3N_4$ is more than 60.0%, it is difficult to obtain a thermal expansivity as high as that of a silicon wafer, that is, it is difficult to bring the coefficient of thermal expansion at −50 to 500° C. to $3.0 \times 10^{-6}$/° C. or more. Accordingly, the content of $Si_3N_4$ is to range from 20.0 to 60.0%. A lower limit of the content of $Si_3N_4$ is preferably 25.0%, and more preferably 30.0%. An upper limit of the content of $Si_3N_4$ is preferably 55.0%, and more preferably 50.0%.

$ZrO_2$: 25.0 to 70.0%

$ZrO_2$ is useful for giving a high thermal expansivity to the ceramic, and 25.0% or more of $ZrO_2$ needs to be contained. However, if a content of $ZrO_2$ is more than 70.0%, the thermal expansivity becomes excessively high, which makes it difficult to obtain a thermal expansivity as high as that of a silicon wafer, that is, it is difficult to bring the coefficient of thermal expansion at −50 to 500° C. to $6.0 \times 10^{-6}$ 1° C. or less. Accordingly, the content of $ZrO_2$ is to range from 25.0 to 70.0%. A lower limit of the content of $ZrO_2$ is preferably 30.0%, and more preferably 35.0%. An upper limit of the content of $ZrO_2$ is preferably 65.0%, and more preferably 60.0%.

Some $ZrO_2$ have a crystalline structure being a monoclinic crystal, a tetragonal crystal, or a cubic crystal. In general, in order to give a high strength to a $ZrO_2$ ceramic, a tetragonal crystal $ZrO_2$ with several percent of oxides dissolved therein is preferably used. However, if this tetragonal crystal $ZrO_2$ is exposed for a long time, the tetragonal crystal undergoes phase transition to a monoclinic crystal even when the exposure occurs at a low temperature (less than 200° C.), and this phase transition changes dimensions of the ceramic. For example, this phase transition proceeds at 40° C. or more, and proceeds more significantly at 150° C. or more. Therefore, if such a ceramic is used for a probe guiding member that guides probes of a probe card, the probe guiding member fulfills a function of a probe guiding member at room temperature, whereas as a temperature range for use increases, positions of a plurality of through holes and/or slits through which probes are to be inserted may deviate to inhibit the insertion of the probes. For that reason, it is more preferable to use a cubic crystal $ZrO_2$, which does not undergo the phase transition, that is, does not change the dimensions in a use temperature. Note that the cubic crystal $ZrO_2$ contains about 3 mol % of elements such that Y, and the content of $ZrO_2$ also includes an amount of these elements. Note that the monoclinic crystal $ZrO_2$ is lower in strength than the tetragonal crystal $ZrO_2$ or the cubic crystal $ZrO_2$, and therefore, even in a case where the crystalline structure includes the monoclinic crystal $ZrO_2$, a proportion of the monoclinic crystal $ZrO_2$ is preferably 50% or less, more preferably 10% or less, and may be 0%.

One or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$: 5.0 to 15.0%

In a case where the ceramic according to the present invention is used to various applications, the ceramic needs to be subjected to fine machining. For example, in order to use the ceramic as a probe guiding member, a plurality of through holes and/or slits need to be formed. However, since the ceramic according to the present invention is a high hardness material containing $Si_3N_4$ and $ZrO_2$ as main components, it is difficult to perform this fine machining by mechanical work. Its machined surfaces (e.g., inner surfaces of the through holes of the probe guide) are therefore rough, and when a member subjected to such work is used, particles are produced, which incur damage to various devices or poor inspection. For that reason, it is preferable to perform the fine machining on this ceramic by laser beam machining, but it is difficult even for the laser beam machining to smooth the machined surfaces (e.g., the inner surfaces of the through holes of the probe guide), and it is difficult to completely prevent particles from being produced in the use of the ceramic.

Hence, the ceramic according to the present invention is made to contain a proper amount of oxides. That is, one or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$ need to be contained at 5.0% or more. In contrast, if a content of these oxides is excessive, these oxides incur a decrease in flexural strength, and accordingly, the content of one or more of these oxides is to be 15.0% or less. Therefore, the content of one or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$ is to range from 5.0 to 15.0%. A lower limit of the content is preferably 7.0%, and more preferably 9.0%. An upper limit of the content is preferably 13.0%, and more preferably 11.0%.

In particular, MgO, $Y_2O_3$, $CeO_2$, CaO, and $HfO_2$ each act as a sintering agent as well as the above effect and are additionally effective for stabilizing the crystalline structure of $ZrO_2$ in a form of the cubic crystal. $TiO_2$, $Al_2O_3$, $SiO_2$, $MoO_3$, CrO, CoO, ZnO, $Ga_2O_3$, $Ta_2O_5$, NiO, and $V_2O_5$ each act as a sintering agent as well as the above effect. Therefore, it is preferable for the ceramic to contain one or more oxides selected from MgO, $Y_2O_3$, $CeO_2$, CaO, and $HfO_2$, and one or more oxides selected from $TiO_2$, $Al_2O_3$, $SiO_2$, $MoO_3$, CrO, CoO, ZnO, $Ga_2O_3$, $Ta_2O_5$, NiO, and $V_2O_5$.

Contents of the respective components (mass %) can be measured by the ICP emission spectral analysis. Note that no specific limitation is imposed on the balance other than the components described above, but it is preferable to reduce the balance as much as possible, and a content of the balance is preferably 10.0% or less, more preferably 5.0% or less, and may be 0%. Examples of the balance include BN, AlN, SiC, and the like.

Coefficient of Thermal Expansion at −50 to 500° C.: $3.0 \times 10^{-6}$ to $6.0 \times 10^{-6}$/° C. In a case where the ceramic according to the present invention is used for a probe guide, the ceramic is required to have a coefficient of thermal expansion as high as that of a silicon wafer on which IC chips are formed. This is because, when a temperature in the inspection changes, positions of the IC chips move with thermal expansion of the silicon wafer. At the time, in a case where the probe guide has a coefficient of thermal expansion as high as that of the silicon wafer, the probe guide moves in synchronization with expansion and contraction of the silicon wafer, which enables a high precision inspection to be kept. This also applies to a case where the ceramic according to the present invention is used for a socket for inspection. Accordingly, a reference coefficient of thermal expansion at −50 to 500° C. is $3.0 \times 10^{-6}$ to $6.0 \times 10^{-6}$/° C.

Flexural Strength: 600 MPa or More

In a case where the ceramic according to the present invention is used for a probe guide, the ceramic is required to have mechanical properties sufficient to withstand contact and a load of probes and the like in the inspection. In particular, the ceramic is required to have a flexural strength that is higher than ever before, in order to meet a demand for reductions of size and thickness of probe guides. This also applies to a case where the ceramic according to the present invention is used for a socket for inspection. Accordingly, a reference flexural strength is 600 MPa or more, and more preferably 700 MPa or more.

Micromachinability

Regarding micromachinability, a machining precision of pulse laser machining performed on a ceramic material having a thickness of 0.3 mm to form nine 50-μm-square through holes is evaluated by observing shapes of the holes on a side to which laser beams come out by a vision measuring system (e.g., Quick Vision from Mitutoyo Corporation) (a case where the machining precision falls within ±2 μm is rated as good).

Roughness of Machined Surface

Regarding a roughness of the machined surface, nine 50-μm square through holes are formed on a ceramic material having a thickness of 0.3 mm by the pulse laser machining, given five visual fields of inner surfaces of the machined holes are measured over a length of 100 μm or more under a laser confocal microscope (VK-X150 from KEYENCE CORPORATION), skew correction is performed to calculate Ra, and an average value of Ra is evaluated. Ra being 0.25 μm or less is rated as good.

Occurrence of Crack after Heat Treatment at 150° C.

Regarding occurrence of a crack after heat treatment at 150° C., a ceramic material having a thickness 0.3 mm is heated from room temperature to 150° C. at 5° C./min, retained at 150° C. for 100 hours, then allowed to be naturally cooled at room temperature, and after being left still for 5 hours since a temperature of the ceramic reaches the room temperature, five or more visual fields of the ceramic are captured under a digital microscope (VHX-6000 from KEYENCE CORPORATION) at 200× observation magnification, and from captured images, whether a crack occurs is evaluated. A case where no crack occurs is rated as ◯, and a case where a crack occurs is rated as x.

2. Method for Producing Ceramic

An example of a method for producing the ceramic according to the present invention will be described below.

Si$_3$N$_4$ powder, ZrO$_2$ powder, and one or more oxide powders selected from MgO, Y$_2$O$_3$, CeO$_2$, CaO, HfO$_2$, TiO$_2$, Al$_2$O$_3$, SiO$_2$, H$_2$MoO$_4$ (to be MoO$_3$ after sintering), CrO, CoO, ZnO, Ga$_2$O$_3$, Ta$_2$O$_5$, NiO, and V$_2$O$_5$ are mixed by a known method such as one using a ball mill. That is, the powders, solvent, resin-made balls each including a ceramic-made or iron-made core therein are mixed in a container to be formed into slurry. At that time, as the solvent, water or alcohol can be used. In addition, an additive such as a dispersant and a binder may be used as necessary.

The obtained slurry is formed into grains by a known method such as spray drying and a method using a decompression evaporator. That is, the slurry is spray-dried by a spray dryer to be formed into granules or is dried by the decompression evaporator to be formed into powder.

The obtained powder is sintered under a high temperature and a high pressure by, for example, a known method such as hot pressing and hot isostatic pressing (HIP) to be formed into a sintered ceramic body. In the case of the hot pressing, the powder may be calcined in a nitrogen atmosphere. In addition, a temperature of the calcination is to range from 1300 to 1800° C. If the temperature is excessively low, the sintering becomes insufficient, and if the temperature is excessively high, a problem such as liquating oxide components arises.

An appropriate pressing force ranges from 10 to 50 MPa. In addition, a duration of maintaining the pressing force is normally about 1 to 4 hours, which however depends on the temperature or the dimensions. Also in a case of the HIP, calcination conditions including the temperature and the pressing force are to be set as appropriate. Alternatively, a known calcination method such as a pressureless calcination method and an atmosphere pressing calcination may be adopted.

EXAMPLE

In order to confirm the effects of the present invention, Si$_3$N$_4$ powder, ZrO$_2$ powder, and one or more oxide powders selected from MgO, Y$_2$O$_3$, Al$_2$O$_3$, SiO$_2$, CeO$_2$, TiO$_2$, and H$_2$MoO$_4$ (to be MoO$_3$ after sintering) were mixed at various compounding ratios with water, dispersant, resin, and ceramic-made balls, and obtained slurries were each spray-dried by a spray dryer to be formed into granules. The obtained granules were charged into a graphite-made dice (mold) and subjected to hot pressing calcination in a nitrogen atmosphere, under a pressure of 30 MPa, at 1700° C., for 2 hours, to be formed into test materials being 150 mm long×150 mm wide×30 mm thick.

From the obtained test materials, test specimens were taken and subjected to various kinds of tests.

<Thermal Expansivity>
A coefficient of thermal expansion of each of the test materials at −50 to 500° C. was determined in conformity with JIS R1618.

<Flexural Strength>
A three-point flexural strength of each of the test materials was determined in conformity with JIS R1601. A case where the flexural strength was 600 MPa or more was rated as good.

<Relative Density>
A bulk density of each of the test materials was determined in conformity with JIS C2141, and the determined bulk density was divided by a theoretical density, by which a relative density was determined. A case where the relative density was 90% or more was rated as good.

<Young's Modulus>
A Young's modulus of each of the test materials was determined in conformity with JIS R1602. A case where the Young's modulus was 230 GPa or more was rated as good.

Figure 8:
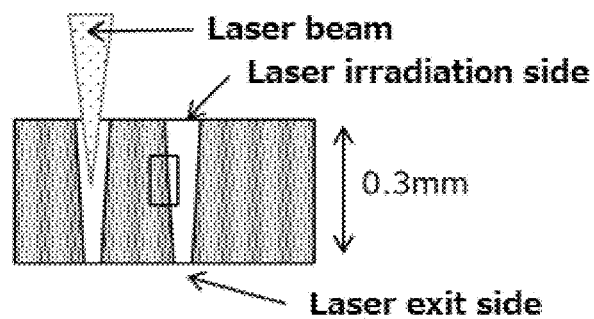
FIG. 8 is a schematic diagram of laser beam machining.

<Micromachinability>
Regarding micromachinability, a machining precision of pulse laser machining performed on a ceramic material having a thickness of 0.3 mm to form nine 50-μm-square through holes was evaluated by observing shapes of the holes on a side to which laser beams came out by a vision measuring system (e.g., Quick Vision from Mitutoyo Corporation) (a case where the machining precision fell within ±2 μm was rated as good). A case where holes each having a machining precision of within ±2 μm were successfully formed was rated as "◯," and the other cases (a case where the material was left, a case where shapes of the holes were distorted, etc.) were rated as "x." FIG. 8 is a schematic diagram of the laser beam machining. As illustrated in Figured 8, a side of a ceramic to be irradiated with laser light will be referred to as a laser irradiation side, and a side of the ceramic opposite to the laser irradiation will be referred to as a laser beam coming-out side.

<Roughness of Machined Surface>
Regarding a roughness of the machined surface, nine 50-μm square through holes were formed on the ceramic material having a thickness of 0.3 mm by the pulse laser machining, given five visual fields of inner surfaces of the machined holes were measured over a length of 100 μm or more under a laser confocal microscope (VK-X150 from KEYENCE CORPORATION), skew correction was performed to calculate Ra, and an average value of Ra was evaluated. Ra being 0.25 μm or less was rated as good. The roughness of the machined surface is determined by observing a cross section of the ceramic material parallel to a thickness direction of the ceramic material in an area including a thickness center portion of an inner surface of each hole (specifically, a portion surrounded by a rectangle illustrated in FIG. 8).

TABLE 1

| | | Component (mass %) | | | | | | | | | | | Thermal |
| | | Main component | | | Oxide 1 | | | Oxide 2 | | | | Total of oxide | expansivity ($\times 10^{-6}$/ ° C.) |
| | | Si$_3$N$_4$ | ZrO$_2$ | Others | MgO | Y$_2$O$_3$ | CeO$_2$ | Al$_2$O$_3$ | SiO$_2$ | TiO$_2$ | MoO$_3$ | | |
|---|---|---|---|---|---|---|---|---|---|---|---|---|---|
| Examples | 1 | 24.0 | 68.2 | — | — | 4.6 | — | 1.8 | 0.9 | 0.5 | — | 7.8 | 5.0 |
| | 2 | 30.6 | 57.9 | — | 1.8 | 5.3 | 1.8 | 2.6 | — | — | — | 11.5 | 4.8 |
| | 3 | 40.7 | 51.5 | — | — | 5.5 | — | 1.8 | — | — | 0.5 | 7.8 | 4.2 |
| | 4 | 40.5 | 51.2 | — | 5.5 | — | — | 2.8 | — | — | — | 8.3 | 4.3 |
| | 5 | 51.1 | 41.5 | — | — | 6.5 | — | 0.9 | — | — | — | 7.4 | 3.7 |
| | 6 | 50.9 | 41.3 | — | — | 5.5 | — | 1.9 | — | 0.4 | — | 7.8 | 3.4 |

TABLE 1-continued

| | | | | | | | | | | | | | |
|---|---|---|---|---|---|---|---|---|---|---|---|---|---|
| | 7 | 58.8 | 27.9 | — | 3.5 | 7.3 | — | 0.8 | 1.7 | — | — | 13.3 | 3.0 |
| | 8 | 34.0 | 57.3 | — | — | 4.1 | — | — | 3.7 | 0.9 | — | 8.7 | 4.6 |
| | 9 | 52.8 | 37.0 | — | 2.3 | 7.4 | — | 0.5 | — | — | — | 10.2 | 3.4 |
| | 10 | 52.3 | 33.1 | — | 3.4 | 7.4 | — | 3.4 | — | 0.4 | — | 14.6 | 3.2 |
| | 11 | 36.1 | 56.1 | — | — | 6.9 | — | — | — | 0.2 | 0.7 | 7.8 | 4.6 |
| | 12 | 24.6 | 69.9 | — | — | 4.6 | 0.9 | — | — | — | — | 5.5 | 5.0 |
| | 13 | 40.0 | 50.6 | — | — | 5.7 | 3.7 | — | — | — | — | 9.4 | 4.4 |
| | 14 | 40.0 | 50.6 | — | — | — | — | 9.4 | — | — | — | 9.4 | 4.5 |
| | 15 | 40.0 | 50.6 | — | — | 1.1 | — | 8.3 | — | — | — | 9.4 | 4.5 |
| | 16 | 29.7 | 62.4 | — | — | 6.6 | — | 1.2 | — | — | — | 7.8 | 5.3 |
| | 17 | 21.0 | 70.0 | — | 1.1 | 5.8 | — | 2.1 | — | — | — | 9.0 | 5.7 |
| Comparative examples | 1 | 75.1* | 15.8* | — | — | 5.5 | — | 3.6 | — | — | — | 9.1 | 2.0# |
| | 2 | 17.5* | 77.6* | — | 1.4 | — | — | 1.0 | 1.0 | 1.0 | 0.5 | 4.9* | 6.1# |
| | 3 | 10.7* | 81.8* | — | 1.9 | 1.9 | — | 3.7 | — | — | — | 7.5 | 6.7# |
| | 4 | 27.6 | 52.4 | — | — | 20.0 | — | — | — | — | — | 20.0* | 5.3 |
| | 5 | 44.8 | —* | BN:32.6 | — | 5.6 | — | 1.9 | — | — | — | 7.5 | 1.4# |
| | 6 | 12.5* | 47.4 | BN:32.6 | — | 5.6 | — | 1.9 | — | — | — | 7.5 | 4.7 |
| | 7 | 95.8* | —* | — | — | 3.1 | — | 1.1 | — | — | — | 4.2* | 1.7# |
| | 8 | —* | —* | AlN:94.0 | — | 6.0 | — | — | — | — | — | 6.0 | 4.4 |
| | 9 | —* | 100.0* | — | — | — | — | — | — | — | — | 0.0* | 8.0# |

| | | Flexural strength (MPa) | Relative Density (%) | Young's modulus (GPa) | ZrO₂ crystal phase | | | Whether to form fine square hole | surface roughness Ra(um) | Crack after heat treatment at 150° C. |
|---|---|---|---|---|---|---|---|---|---|---|
| | | | | | Tetragonal crystal | Cubic crystal | Monoclinic crystal | | | |
| Examples | 1 | 910 | 98.4 | 259 | ○ | — | — | ○ | 0.11 | ○ |
| | 2 | 815 | 98.8 | 269 | ○ | — | — | ○ | 0.13 | ○ |
| | 3 | 890 | 98.2 | 268 | ○ | — | — | ○ | 0.19 | ○ |
| | 4 | 943 | 97.5 | 264 | ○ | — | — | ○ | 0.17 | ○ |
| | 5 | 1021 | 98.3 | 271 | ○ | — | — | ○ | 0.18 | ○ |
| | 6 | 1166 | 98.3 | 273 | ○ | — | — | ○ | 0.16 | ○ |
| | 7 | 855 | 99.0 | 281 | ○ | — | — | ○ | 0.19 | ○ |
| | 8 | 882 | 98.6 | 263 | ○ | — | — | ○ | 0.16 | ○ |
| | 9 | 937 | 98.4 | 277 | ○ | — | — | ○ | 0.18 | ○ |
| | 10 | 847 | 98.6 | 263 | ○ | — | — | ○ | 0.18 | ○ |
| | 11 | 808 | 98.0 | 268 | ○ | — | — | ○ | 0.15 | ○ |
| | 12 | 877 | 97.4 | 261 | ○ | — | — | ○ | 0.13 | ○ |
| | 13 | 912 | 98.1 | 274 | ○ | — | — | ○ | 0.19 | ○ |
| | 14 | 1334 | 99.1 | 299 | — | ○ | — | ○ | 0.21 | x |
| | 15 | 1221 | 98.8 | 295 | — | ○ | ○ | ○ | 0.18 | x |
| | 16 | 854 | 99.1 | 261 | ○ | — | — | ○ | 0.16 | ○ |
| | 17 | 863 | 98.4 | 252 | ○ | — | — | ○ | 0.14 | ○ |
| Comparative examples | 1 | 944 | 97.0 | 280 | ○ | — | — | ○ | 0.28 | ○ |
| | 2 | 984 | 98.1 | 257 | ○ | — | — | x Shape distorted | — | ○ |
| | 3 | 1014 | 98.9 | 256 | ○ | — | — | x Material left | — | ○ |
| | 4 | 561# | 99.2 | 265 | ○ | — | — | x Shape distorted | — | ○ |
| | 5 | 452# | 97.2 | 130 | ○ | — | — | ○ | 0.33 | ○ |
| | 6 | 361# | 97.7 | 157 | ○ | — | — | x Material left | — | ○ |
| | 7 | 785 | 97.6 | 285 | — | — | — | ○ | 0.29 | ○ |
| | 8 | 348# | 98.7 | 320 | — | — | — | x Material left | — | ○ |
| | 9 | 880 | 97.8 | 245 | — | ○ | — | x Material left | — | x |

*It means that the content falls out of the respective range specified in the present invention.
It means that it does not have required properties in the present invention.

Figure 3:
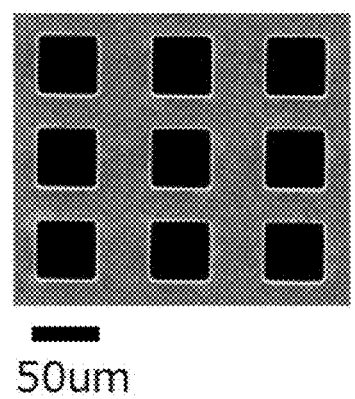
FIG. 3 is a picture of micromachined holes in Example 6 captured from above.
Figure 4:
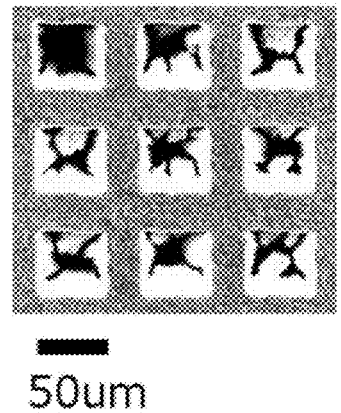
FIG. 4 is a picture of micromachined holes in Comparative example 3 captured from above.
Figure 5:
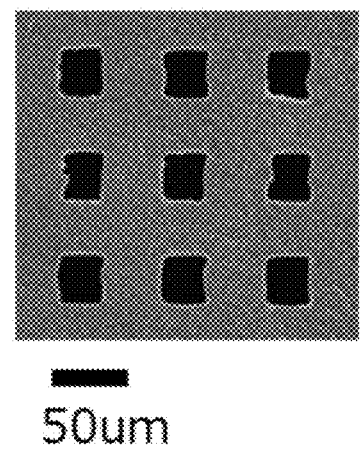
FIG. 5 is a picture of micromachined holes in Comparative example 4 captured from above.
Figure 6:
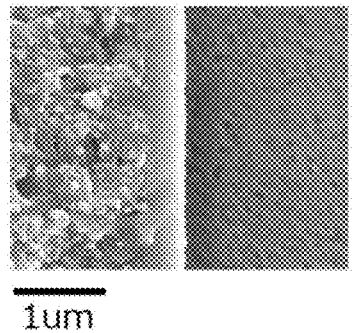
FIG. 6 is a picture of a micromachined hole in Example 6 captured from inside.
Figure 7:
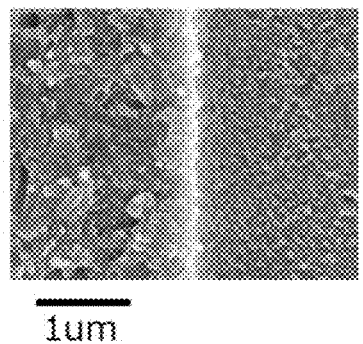
FIG. 7 is a picture of a micromachined hole in Comparative example 5 captured from inside.

FIG. 3 is a picture of micromachined holes in Example 6 captured from above, FIG. 4 is a picture of micromachined holes in Comparative example 3 captured from above, and FIG. 5 is a picture of micromachined holes in Comparative example 4 captured from above. FIG. 6 is a picture of a captured inner surface of a micromachined hole in Example 6, and FIG. 7 is a picture of a captured inner surface of a micromachined hole in Comparative example 5.

As shown in Table 1, in Comparative examples 1 and 7, they were excessively high in $Si_3N_4$ and excessively low in $ZrO_2$, and thus their thermal expansivities were decreased. In Comparative examples 2 and 3, they were excessively low in $Si_3N_4$ and excessively high in $ZrO_2$, and thus they had high thermal expansivities and degraded micromachinability. In Comparative example 4, it was excessively high in $Y_2O_3$, and thus its thermal expansivity was high, and its flexural strength and micromachinability were degraded. In Comparative examples 5 and 6, although they contained BN as their main components, their contents of $Si_3N_4$ or $ZrO_2$ fell out of the respective ranges specified in the present invention, and thus their flexural strengths were degraded. In Comparative example 8, although it contained AlN as its main component, its content of $Si_3N_4$ or $ZrO_2$ fell out of the respective ranges specified in the present invention, and thus its flexural strength was degraded. In Comparative example 9, it consisted of only $ZrO_2$, and thus it had excellent qualities such as flexural strength, whereas its thermal expansivity was excessively high, and its micromachinability was degraded.

In contrast, in Examples 1 to 17, their thermal expansivities and flexural strengths both fell within satisfactory ranges, and in addition, they were excellent in the micromachinability and the roughness of machined surface. In particular, as a result of the micromachining, precise holes were successively formed in Example 6, whereas the material was left in Comparative example 3, and shapes of holes were distorted in Comparative example 4, as illustrated in FIGS. 3 to 5. As illustrated in FIG. 6 and FIG. 7, Example 6 shows a low surface roughness inside its holes (Ra: 0.16 as shown in Table 1), whereas Comparative example 5 showed a high surface roughness inside its holes (Ra: 0.33 as shown in Table 1). In Example 14 and Example 15, although they satisfied the required qualities, they contained the tetragonal crystal $ZrO_2$, and thus the occurrence of a crack was recognized after the heat treatment at 150° C. These ceramics can be used at normal temperature without any trouble but are unfit for use in a heated condition.

INDUSTRIAL APPLICABILITY

The present invention makes it possible to obtain a ceramic that has a coefficient of thermal expansion as high as that of silicon and an excellent mechanical strength, allows fine machining with high precision, includes a smooth machined surface, and can prevent particles from being produced in its use, which is thus useful particularly to a probe guiding member, a probe card, and a socket for inspection.

The invention claimed is:

1. A ceramic containing, in mass percent:
  $Si_3N_4$: 20.0 to 60.0%;
  $ZrO_2$: 25.0 to 70.0%;
  wherein the ceramic contains, in mass percent, 5.0 to 15.0% of:
    one or more oxides selected from MgO, $Y_2O_3$, $CeO_2$, CaO, and $HfO_2$; and
    one or more oxides selected from $TiO_2$, $Al_2O_3$, $SiO_2$, $MoO_3$, CrO, CoO, ZnO, $Ga_2O_3$, $Ta_2O_5$, NiO, and $V_2O_5$; and
  the balance being 10.0% or less.

2. The ceramic according to claim 1, wherein a crystal phase of $ZrO_2$ is one of a crystal phase being a tetragonal crystal, a crystal phase being a tetragonal crystal and a monoclinic crystal, a crystal phase being a cubic crystal, a crystal phase being a cubic crystal and a tetragonal crystal, and a crystal phase being a cubic crystal and a monoclinic crystal.

3. The ceramic according to claim 1, wherein $ZrO_2$ is a cubic crystal.

4. The ceramic according to claim 1, wherein the ceramic has a coefficient of thermal expansion at −50 to 5500° C. ranging from $3.0 \times 10^{-6}$ to $6.0 \times 10^{-6}$/° C. and has a three-point flexural strength of 700 MPa or more.

5. A probe guiding member that guides probes of a probe card, the probe guiding member comprising:
  a plate-shaped main body that is made of the ceramic according to claim 1; and
  the main body includes a plurality of through holes and/or slits through which the probes are to be inserted.

6. The probe guiding member according to claim 5, wherein a surface roughness of inner surfaces of the plurality of through holes and/or slits is 0.25 μm or less in terms of Ra.

7. A probe card comprising:
  a plurality of probes; and
  the probe guiding member according to claim 5.

8. A socket for package inspection, wherein the socket for package inspection is made of the ceramic according to claim 1.

9. The ceramic according to claim 2, wherein $ZrO_2$ is a cubic crystal.

10. The ceramic according to claim 2, wherein the ceramic has a coefficient of thermal expansion at −50 to 500° C. ranging from $3.0 \times 10^{-6}$ to $6.0 \times 10^{-6}$/° C. and has a three-point flexural strength of 700 MPa or more.

11. The ceramic according to claim 3, wherein the ceramic has a coefficient of thermal expansion at −50 to 500° C. ranging from $3.0 \times 10^{-6}$ to $6.0 \times 10^{-6}$/° C. and has a three-point flexural strength of 700 MPa or more.

12. The ceramic according to claim 9, wherein the ceramic has a coefficient of thermal expansion at −50 to 500° C. ranging from $3.0 \times 10^{-6}$ to $6.0 \times 10^{-6}$/° C. and has a three-point flexural strength of 700 MPa or more.

* * * * *